United States Patent [19]

Rolker et al.

[11] 3,900,320

[45] Aug. 19, 1975

[54] ACTIVATION METHOD FOR ELECTROLESS PLATING

[75] Inventors: John H. Rolker, Altadena; Bradley A. Carson, Monrovia, both of Calif.

[73] Assignee: Bell & Howell Company, Chicago, Ill.

[22] Filed: Sept. 30, 1971

[21] Appl. No.: 185,106

[52] U.S. Cl. .......................... 96/35.1; 106/1; 96/36; 204/30

[51] Int. Cl. .......................... B44d 1/092; C23c 3/02

[58] Field of Search ............ 117/47 A, 160 R, 47 R, 117/46 CA, 227, 34, 5.5, 212; 106/1; 204/30; 96/36

[56] References Cited

UNITED STATES PATENTS

| | | | |
|---|---|---|---|
| 3,262,790 | 7/1966 | Fitch | 117/46 CA |
| 3,347,724 | 10/1967 | Schneble et al. | 117/47 A |
| 3,523,824 | 8/1970 | Powers et al. | 117/227 |
| 3,615,471 | 10/1971 | Lenoble | 96/38.3 |
| 3,642,476 | 2/1972 | Mesky | 117/160 R |
| 3,672,986 | 6/1972 | Schneble et al. | 117/5.5 |
| 3,719,490 | 3/1973 | Yudelson et al. | 117/34 |
| 3,779,758 | 12/1973 | Polichette | 96/36.2 |

OTHER PUBLICATIONS

The Condensed Chemical Dictionary, 6th Ed., N.Y., Reinhold, 1961, p. 439, QD5C5 1961 C33.

*Primary Examiner*—William D. Martin
*Assistant Examiner*—Janyce A. Bell
*Attorney, Agent, or Firm*—Nilsson, Robbins, Bissell, Dalgarn & Berliner

[57] ABSTRACT

A process for metallizing a plastic or ceramic base. A pre-plate solution comprising a compound of catalytic metal, such as a palladium salt, binder material such as one or more polymers and/or polymer formers, and solvent are applied to the base and dried so as to form a polymer layer of about 20°A to about 3000°A thick which may thereafter be directly plated by contact with an electroless plating solution. The pre-plate solution has specified viscosity characteristics and concentration levels of catalytic metal compound. A tenacious plate can be obtained on a ceramic base by pyrolyzing the polymer layer and thereafter applying an electroless plating solution. A photosensitive polymer former can be used as a component of the pre-plate solution for photographically developing a plateable pattern on a substrate such as a circuit board, printing plate or the like.

7 Claims, 7 Drawing Figures

INVENTORS
JOHN H. ROLKER
BRADLEY A. CARSON
BY
NILSSON, ROBBINS, WILLS & BERLINER
ATTORNEYS

INVENTORS
JOHN H. ROLKER
BRADLEY A. CARSON
BY.
NILSSON ROBBINS WILLS & BERLINE
ATTORNEYS

ACTIVATION METHOD FOR ELECTROLESS PLATING

CROSS REFERENCE TO RELATED APPLICATIONS

Subject matter disclosed herein is disclosed or disclosed and claimed in one or more of the following patent applications of common assignment and filed concurrently herewith:

An application Ser. No. 185,109, filed Sept. 30, 1971 entitled METAL ENCAPSULATION by John H. Rolker and Bradley A. Carson;

An application Ser. No. 185,104, filed Sept. 30, 1970 entitled MAGNETIC PRINTOUT METHODS AND MEDIA by John H. Rolker and Bradley A. Carson, now abandoned; and An application Ser. No. 185,105, filed Sept. 30, 1971 entitled MAGNETIC PRINTOUT METHODS AND MEDIA by John H. Rolker, now abandoned.

FIELD OF THE INVENTION

The fields of art to which the invention pertains include the fields of coating processes, metal depositing processes, coating compositions, plastic compositions and photographic processes and materials.

BACKGROUND AND SUMMARY OF THE INVENTION

The present invention relates to electroless metal deposition and more particularly to a method for treating a substrate so as to activate its surface for electroless plating. Electroless metal deposition refers to the chemical deposition of an adherent metal coating on a substrate which is generally non-conductive or semiconductive, but which may be conductive, in the absence of an external electric source.

Metal coated non-metallic substrates are used for a variety of purposes including mirrors, decorative materials, circuit boards, magnetic tape, infrared radiation reflective windows, and a wide variety of consumer products where the appearance of metal is desired. Metal plating gives the article properties of heat reflection, heat conductivity, electrical conductivity, better flame resistance, solvent resistance, weathering resistance and magnetic properties with certain metals. A variety of methods have been available for applying metal coatings to non-metallic substrates including: vacuum evaporation or sputtering where the substrate has metal vapor applied to its surface; cladding of metal where thin layers of metal are glued, fused or sintered into place; chemical vapor deposition where chemical compounds of the metal are decomposed at elevated temperatures onto the substrate; and electroless plating where the substrate is made susceptible to a buildup of metals by a chemical redox reaction. It is the latter method to which this invention will refer most specifically, but the method of surface treatment herein provides an activated surface which can advantageously be used in applying the desired metal in accordance with any of the other methods outlined.

The usual prior art method of providing an electroless metal coating on non-conductive or semiconductive substrates comprises: very thoroughly cleaning the substrate surface; rinsing the cleaned surface; mechanically lapping the surface or deglazing with an oxidizing acid; rinsing the lapped or the glazed surface; sensitizing the surface by immersion in a bath containing stannous chloride or other stannous salt; rinsing the sensitized surface; seeding or catalyzing the surface to provide catalytic nucleating centers by immersion in a salt of a metal catalytic to deposition of the desired metal coating, such as silver nitrate or the chloride of gold, palladium or platinum, these metal ions being reduced to catalytic metal nucelating centers by the stannous ions absorbed on the substrate and/or by reducing agent contained in the electroless metal deposition bath; rinsing the catalyzed surface; and thereafter depositing the desired metal, such as copper, nickel, cobalt or the like, by treating the catalyzed surface with a salt of the desired metal plus a reducing agent therefor. Each of the foregoing steps requires from several seconds to 5 minutes or more to accomplish. When plating on a plastic substrate, the surface should be abraded as by vapor-blasting or by other method prior to the cleaning-sensitization-activation sequence. Specific examples of prior art methods can be found in U.S. Pat. Nos. 3,535,147, 3,532,518, 3,522,094, 3,501,332, 3,485,643, 3,472,664, 3,471,320, 3,467,540, 3,379,556, 3,340,164, 3,306,831, 3,245,826, 3,226,256, 3,212,917, 3,146,125, 3,099,572, 3,093,509, 3,011,920, 2,976,169, 2,917,439, 2,764,502, 2,702,253, 2,454,610, 2,303,871 and 2,278,722.

Once a catalytic metal has been reduced from its catalytic salt, there appears to be no problem in forming a metal coating by electroless plating to form a conductive surface for a subsequent electroplating step. However, once the final metal is electroplated, and the metallized substrate is put to use, difficulties often arise because of low adhesion characteristics between the metal and the substrate on which it is coated. Metallized plastic which can be bent or deformed is particularly subject to chipping, flaking and peeling. There is also a tendency for the substrate to discolor during the pre-plating processing. This is disadvantageous for thin, optically transmissive metal coatings on materials useful for their optical properties.

More recently, a variety of techniques have been developed for metallizing metal surfaces which involve the use of plastic-compatible solvents to apply the activated salt to the plastic substrate to thereby embed the salt within the surface of the substrate. See for example Kovac et al. U.S. Pat. No. 3,488,166, Emons, Jr. U.S. Pat. No. 3,425,946 and Rowe U.S. Pat. No. 3,533,828. In Powers and Romankiw Patent No. 3,523,824 a process is disclosed in which several strongly adherent insulating layers, formed of solvent-based, polyamide varnish, are coated on a metal base to provide an insulated substrate. The uppermost insulating layer is loaded with a catalytic metal compound such as nickel hexachloropalladate, palladium nitrate or palladium trimethylbenzyl ammonium nitrite. After curing or drying, only those catalytic particles which are exposed through the surface of the top layer are reduced, by heating in a non-oxidizing gas or by dipping in a solution of strong reducing agent such as sodium hypophosphite, so as to produce a layer of active metal to plastic bonding site at the surface of the uppermost insulating layer.

In Schneble, Jr. et al. U.S. Pat. No. 3,560,257, resin binder catalytic inks, with or without a solvent, and unpolymerized catalytic resin strips, which are described as "thin" but which are thick enough to be pre-molded, are formed with relatively low amounts of catalytic noble metal compounds or complexes.

The present invention provides a method for activating a substrate for electroless plating thereon which is much simpler to use than the general prior art method as above indicated and which provides adhesion properties with many substrates which have not heretofore been obtained. In the present method a solution having specific viscosity characteristics is prepared comprising a binder material such as one or more polymers and/or polymer formers, specific concentrations of a compound of catalytic metal and at least one solvent for the binder material and compound. The solution is applied to a base and dried so as to form a polymer layer having a thickness of about 20A – 3000A. If the substrate is formed of plastic, i.e., organic polymer, an electroless plating solution can be applied directly to the polymer coated substrate. If the substrate is formed of ceramic or other heat-resistant material, the coated substrate can be heated to pyrolyze the polymer layer and then an electroless plating solution is applied.

In contrast to the general methods which utilize successive applications of sensitizer and activator, only a single preplating solution need be used and the substrate surface does not require special cleaning or preparation. Plastic surfaces can be readily activated in a manner that does not require a special reducing step and the process does not discolor the substrate. In contrast to the Powers and Romankiw method of U.S. Pat. No. 3,523,824, the polymer layer formed by the present process is itself sufficiently thin (20A – 3000A) so that the active metal salt reduces to nucleating metal sites without special handling or reducing procedures. Reduction takes place either as a result of using moderate air drying temperatures (e.g., 50°C) or immediately upon contact with a reducing component of the electroless plating bath. As a result of utilizing such a thin polymer layer, the binder can be applied from a solvent which need not be compatible with the substrate plastic. This enables much less expensive salts such as palladium chloride and palladium acetate to be used with common and inexpensive solvents or solvent pairs without regard for the substrate.

As above indicated, when the binder solution is applied to a ceramic or other temperature resistant substrate, it is advantageous to employ an additional step wherein the substrate is heated to decompose and otherwise pyrolyze the polymer. Pyrolysis apparently diffuses the metal nucleating sites partly into the ceramic substrate, resulting in exceptional adhesion of the electrolessly plated layer.

As noted, the pre-plate solution has specified viscosity characteristics and concentration levels of catalytic metal compound. In particular, the solution has a viscosity under the conditions of its application to the base, as will be detailed below, equivalent to a Newtonian fluid viscosity of about 0.2 to about 100 centipose. The weight ratio of the binder material to the metal component of the metal compound in the solution is from about 0.3:1 to about 15:1. These characteristics and concentrations enable the formation of a coating with sufficient catalysis sites to be practical and effective and sufficiently thin to form a strongly adherent, economical plate.

A specific aspect of the present invention relates to the provision of novel photoresist techniques. In the usual procedure of making a metal image for conductive, magnetic or relief purposes, a polymeric surface is prepared by a variety of etching, cleaning, catalyzing and sensitizing treatments. A uniform metal layer is then electrolessly plated onto the prepared surface and a photoresist is applied, image-wise exposed, developed and etched. Various additional cleaning, baking and photoresist removal steps are frequently necessary. The metal layer is then built up in thickness by electroplating or is built up before application of the photoresist. The total process is long, tedius, costly and allows for error in each step. In accordance with this aspect of the present invention, a metal image can be plated without the usual surface preparations. The pre-plate solution is formulated with a photosensitive polymer or polymer-former in place of or in addition to the above-mentioned binder material. A thin layer of the photosensitive pre-plate solution is then coated onto the surface to be plated, imaged through a suitable mask, photographic film or the like, and developed. The unpolymerized portions are simply washed away, leaving a polymerized image containing catalytic nucleating sites. Thereafter, an electroless plating solution is applied which deposits metal onto the polymer image only. Greater metal thicknesses can be obtained, if desired, by a conventional electroplating step.

In a further embodiment of this aspect of the invention in place of the pre-plate solution, one utilizes a mixture of fine particles of noble metal or reducible noble metal compound and photosensitive binder material.

In each case the result is a significant reduction in process time. Since no etching is utilized, undercut edges are avoided and a more precise image is obtainable. The process enables the rapid and simple preparation of ultra-micro and micro electronic circuitry, allows economic relief or intaglio printing processes, enables the ready preparation or archival copies and provides an electrostatic (metal versus insulator) image or a magnetic (magnetic metal versus non-magnetic surface) image for use in electrostatic or magnetic duplicating processes. Either positive or negative working processes can be employed by simple selection of polymer formers, photo-initiators and development techniques.

DETAILED DESCRIPTION

Figure 1:
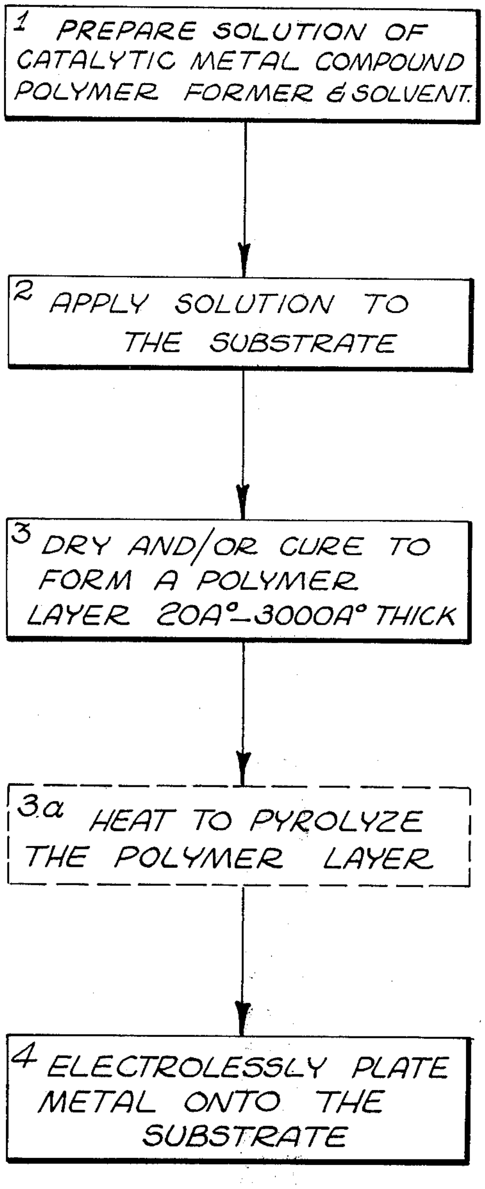
FIG. 1 is a flow chart diagrammatically outlining the principle method steps for activating and metallizing a substrate.
Figure 2A:
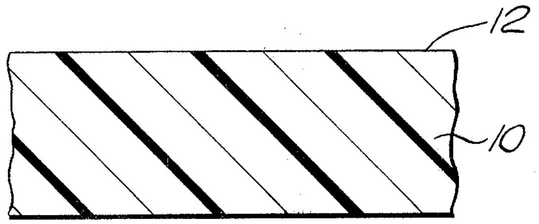
FIGS. 2*a*–2*f* are schematic sectional views depicting various stages in the preparation of a metal image.
Figure 2B:
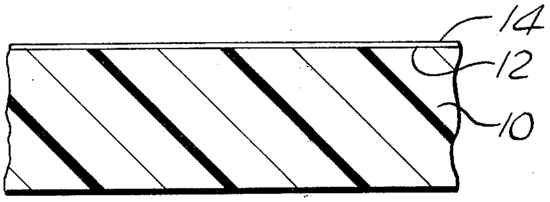
Figure 2C:
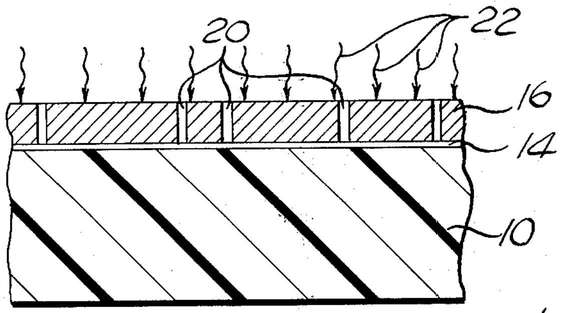
Figure 2D:
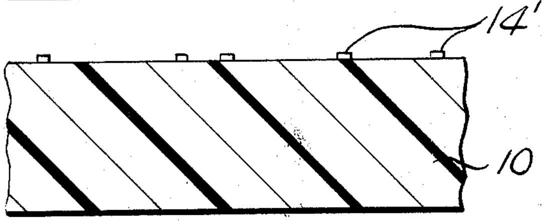
Figure 2E:
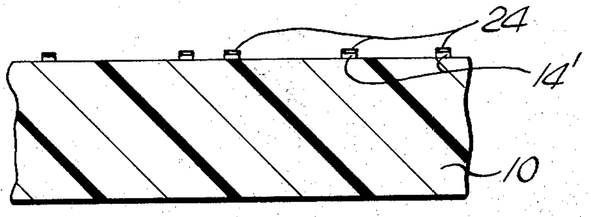
Figure 2F:
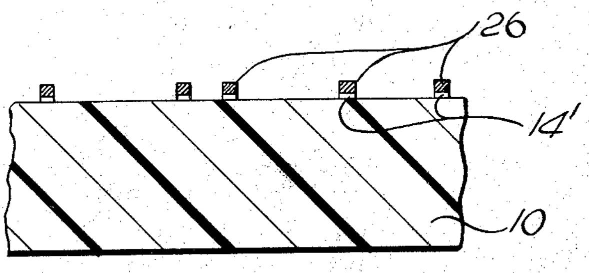

In accordance with the method steps as outlined in chart form in the drawing, a metallized substrate is prepared by a series of steps in which (1) a solution is prepared comprising binder material comprising one or more polymers and/or polymer formers, a compound of catalytic metal in concentration as specified above and solvent having the desired viscosity characteristics, (2) the solution is applied to the substrate, and (3) the solution is dried and/or cured to form a polymer layer having a thickness of about 20A – 3000A. The substrate can then be (4) electrolessly plated or otherwise treated to form a metal layer having good adhesion to the substrate. As indicated in the drawing at step (3*a*) the method can include a pyrolysis step in which the polymer layer is heated to pyrolyze or decompose the polymer material, diffusing the nucleating agents into the surface of the substrate. Such a step is utilized only with substrates which can tolerate the heat required to decompose the polymer layer. In either case the result is a metal layer which is strongly adhered to the substrate. When a pyrolysis step (3*a*) is used with a ceramic or refractory substrate, the result is a particularly tenacious bond between the substrate and metal layer. The following will refer to each of the steps in more detail.

The compound of catalytic metal is a metal compound that is capable of being reduced to its active metal constituent so as to form catalytic metal bonding sites for a further metal plating process. A variety of such compounds are known to the art and they are generally salts of a noble metal such as palladium, platinum, gold, silver, iridium, rhodium, osmium and ruthenium. Examples of such compounds are palladium chloride, palladium acetate, silver bromide, palladium nitrate, palladium trimethylbenzyl ammonium nitrate, nickel hexachloropalladate, silver nitrate, gold chloride, palladium hydroxide and platinum dicarbonyl chloride.

As binder, one can utilize any of the well known inorganic or organic materials which can be dried and/or cured to form a film. For example, one can utilize such inorganic materials as alkali metal silicates, aluminosilicates, phosphonitriles and polyboranes. As useful organic materials one can utilize condensation-type or addition-type polymer forming materials, including monomers which form such polymers. Examples include: cellulose derivatives, such as cellulose nitrate, cellulose acetate and ethyl cellulose; phenolformaldehyde resin; polyamide resins, such as nylon and polymers obtained from dimerized fatty acids; polyester resins, such as alkyds, unsaturated polyesters, polyethylene terephthalate, aromatic polycarbonates and polydiallyl esters; polyether resins, such as epoxy resins, polyethylene oxide, polypropylene oxide, phenoxy resins, polyphenylene oxide resins, polyoxymethylene and chlorinated polyethers; polysulfide resins; polysulfone resins; polyurethane resins; silicone resins, such as polydimethylsiloxane; amino resins, such as urea-formaldehyde resin, melamine-formaldehyde resin; heterocyclic polymers, such as polyvinylcarbazole; polybenzimidazoles and polybenzothiazoles; polyacrylate resins, such as polymethyl methacrylate, polyethyl acrylate, methyl chloroacrylate, cyclohexyl methacrylate and polymethyl-2-cyanoacrylate; polyacrylonitrile resins; acrylonitrile-butadiene resins; polyfluorolefin resins such as polytetrafluroethylene, polymonochlorotrifluroethylene, polyvinylidene fluoride and fluorinated elastomers; polyolefin resins such as polyethylene, polypropylene, polyisobutylene; polypentene-1, poly-4-methylpentene-1, polybutadiene, poly-3-methylbutene-1, polyisoprene and poly-2-chlorobutadiene; polystyrene resins; polyvinyl resins, such as polyvinyl chloride, polyvinyl actate, polyvinylidenechloride, polyvinyl alcohol, polyvinyl acetals, polyvinyl ethers, polyvinyl fluoride, polyvinyl pyrrolidone, polyvinyl carbazole and polyvinyl cinamate, and naturally formed hydrophilic materials, such as starch and starch derivatives, proteins (i.e., casein, zein, gelatin, thiolated gelatin, and the like), alginates, gums and the like.

Generally, the polymer former is used in its liquid state, when it is somewhat polymerized but not fully cross-linked, but if soluble may be used in its fully reacted state, or the material may be used in its monomeric state. Mixtures of polymers and/or monomers, as well as copolymers, can be utilized. When the pre-plate solution is to be applied to a ceramic or other heat-resistant substrate and subsequently pyrolyzed, a polymer former should be chosen which will yield a heat decomposable polymer film. Examples of heat decomposable polymers include polymethyl methacrylate, urethanes, especially those prepared from polyhydroxy aromatics, polyvinyl cinamate, diazo polymers, urea-formaldehyde resins, polyvinyl alcohols, shellac, and the like. Other polymers can be chosen by actual experimentation or by reference to "Stabilization of Synthetic High Polymers" (1964) by G. Ya Gordon (translated from Russian by A. Mercado), published by Daniel Davey & Co, Inc., New York, N.Y., incorporated herein by reference.

The binder material and metal compound are mixed by dissolving each in a suitable solvent and then admixing the solvents to form the pre-plate solution. A single solvent may be used to dissolve both the metal compound and binder material and, particularly with water, an emulsion may be formed. For example, acetone can be used to dissolve both palladium chloride and polyvinyl chloride. On the other hand, particular metal compounds may be insufficiently soluble in a solvent which is most suitable for a particular polymer former. In such case, one can simply choose a solvent for the metal compound which is soluble in the binder-dissolving solvent. For example, palladium acetate as the metal compound may be dissolved in benzene and then added to a cyclohexanone solution of a polyester bis(-phenylisocyanate) methane based polyurethane. Other particular solvents can be chosen in accordance with the solubilities of the materials desired to be combined, which solubilities can be readily determined. Subject to the requirements of viscosity characteristics of the pre-plate solution, as set forth below, any of the common solvents can be utilized, including water, alcohols such as methanol, ethanol, and the like, acetones and other ketones such as methyl ethyl ketone, methyl isobutyl ketone and cyclohexanone, halogenated hydrocarbons such as chloroform and carbon tetrachloride, diethyl ether, petroleum ether, xylene, toluene, benzene, dimethyl formamide, dimethyl sulfoxide, cellosolve acetate, methyl cellosolve acetate, hexane, ethyl acetate, isophorone, mesityl oxide, tetrahydrofuran, cumene, and the like, and combinations thereof.

Generally about 0.0001 to about 1 percent by weight of the metal component of the catalytic compound is present in the formulated pre-plate solution and the ratio of the binder material to metal component of the catalytic compound is from about 0.3:1 to about 15:1, preferably about 0.3:1 to about 8:1. With higher binder material/compound ratios the distribution of metal sites is too spread out to yield uniform, uninterrupted plating. On the other hand, if there is too little binder, the plated metal layer tends to lose adhesion.

It is critically important to the practice of the process as above stated that the viscosity of the pre-plate solution be sufficiently low under the conditions of its application to permit the formation of a layer of about 20A – 3000A thick which, it will be appreciated, is much thinner by orders of magnitude than binder-activator layers generally utilized. In particular, the viscosity of the binder under the conditions of application should be equivalent to a Newtonian fluid viscosity of about 0.2 to about 100 centipoises.

There are in general two broad classes of fluids which can be used to sensitize surfaces: Newtonian and non-Newtonian fluids. By definition, a Newtonian liquid is one in which the viscosity is shear rate independent with no elastic or plastic components in the equation of motion of a part of the liquid under stress. Mathematically, $$F/A = \eta \mathring{\gamma} \quad (1)$$

where $F$ is the force acting on an area of the liquid (A), $\eta$ is the viscosity of the liquid, $\gamma$ is the shear exhibited by the liquid as a result of the shearing stress F/A and $\mathring{\gamma}$ is the rate of shear with time ($d\gamma/dt$). For practical purposes, minor deviations from this law are allowed while still calling a fluid a Newtonian liquid just as there are deviations from the ideal gas laws.

Most of the fluids which are useful in the above processes are Newtonian in character. It is a characteristic of these fluids that they will have a viscosity ($\eta$) between 0.2 and 100 cps, preferably between 0.2 and 10 cps to be particularly well suited for the preparation of surfaces for plating. Polymer precursors present in the pre-plating solution may form polymers, after deposition and/or cure, ranging from low to very high molecular weights. In solution form, however, they are part of the low viscosity Newtonian liquid. A practical definition of Newtonian liquid (after P. J. Flory, *Principles of Polymer Chemistry*, 1953, Cornell U. Press) is that the intrinsic viscosity $[\eta]$ should be <4 in order to be independent of the shear rate.

As is known $$[\eta] = \lim_{C \to 0} \frac{\eta_{soln} - 1}{\eta_{solv} C}$$

where $\eta_{soln}$ = the viscosity of the polymer soln, $\eta_{solv}$ = the viscosity of the solvent and C is the concentration of polymer in solvent in terms of g/100 ml. It is preferred that the polymers and polymer pre-cusors in this invention have $[\eta]<4$.

In the case of clearly non-Newtonian fluids, it has been found that some of these materials can be used to prepare surfaces for pre-plating. A simplified general additive equation for an elastoplastic liquid fluid may be represented as $$F/A = \eta \mathring{\gamma} - k \gamma + \theta \quad (2)$$

where the symbols are the same as in (1) with the addition of $k$ representing the Hookean force constant (elasticity) and $\theta$ the inertial stress (plasticity).

Much more complicated equations and models are needed for many real rheological fluids. Similarly, there are many means for application of fluids to substrates. The combination of these means of application and types of fluids can result in a variety of wet coating films and film properties. Even a simple elastoviscous fluid can be characterized as a Kelvin body if the viscous and elastic forces are in parallel or a Maxwell body if the same forces are in series. The manipulation and preparation of these two types of fluids can be quite different. Many coating processes are almost as complicated as the rheology of fluids. For instance, spray coating can convert a fluid (of various types) to an aerosol which can become a homogeneous fluid after contact with the substrate. A high plastic yield value would give relatively thick films and poor coating uniformity in this case. On the other hand, a reverse kiss roll could transfer thin films of fluids of high plastic and elastic forces to another substrate through high shear and/or rate of shear if a proper balance of cohesive and adhesive forces of fluids and surfaces were maintained. In this case, the substrate would have to conform to the roller. In applications such as the coating of flat films or other substrates with a pre-plate solution, a non-Newtonian fluid might well be convenient because of the exigencies of the coating apparatus. So called "false body" (mostly due to plasticity) is particularly helpful in controlling the fluid under conditions of low shear.

Thus, even when a coating is formulated so as to have substantial elastic and plastic components, the desired end result can be characterized as that equivalent Newtonian liquid applied in a variety of ways including dip, spray and roller coating. This is particularly true for substrates with a substantially non-flat surface. In the case of a flat surface with minor imperfections, the incorporation of plastic and/or elastic components in the fluid can aid in the preparation of a less defect-free surface because of the filling-in of holes and avoidance of protrusions.

Since a non-Newtonian fluid can have a viscosity dependent on shear and shear-rate, no simple measure of its characteristics can be delineated. A description of a non-Newtonian fluid as having a given viscosity at a given shear rate is inadequate since such characteristic would be merely one point of a curve dependent on serveral variables. However, the results of the coating means and fluid formulation should produce substantially the same properties overall of the dry pre-plate coating as that produced by the previously mentioned Newtonian fluid having a viscosity in the range of 0.2 – 100 centipoises.

In order to control the rheology of the fluid for a particular application, one may disperse particles of organic compounds (monomer or polymer) and/or inorganic compounds, which are not necessarily catalytic and are not in a continuous phase with the pre-plate solution but which may be included for control of the rheology or final surface properties. Such particles can constitute up to about 90 percent of the weight of the pre-plate solution.

The second and third steps of the process call for applying the pre-plate solution to the substrate and then drying and/or curing to form a polymer layer. Importantly, only that amount of pre-plate solution is applied which will yield a polymer layer having a thickness of from about 20A to about 3000A. It has been found that by forming such a thin layer of polymer certain advantages are obtained. In the first place, a bond is formed which is in many cases more tenacious than heretofore obtainable. Secondly, reduction of the metal compound to form nucleating sites can take place in air with only mild heating, for example during drying at 50°C, or immediately upon contact with the reducing agent in the electroless plating solution. Thirdly, by using such a thin layer, solvents need not be chosen on the basis of compatibility with the substrate, but can be chosen with regard only to solubilities for the binder material and metal compound, allowing a greater choice of materials and optimization with inexpensive components.

As above-indicated, the pre-plate solution can be applied by simply dipping the substrate into the solution, or by brushing, spraying or rolling the solution onto the substrate. In the case of common plastic substrate, ordinary drying or curing temperatures can be utilized, as well known to the art, generally ranging from room temperature, about 20°C to about 150°C or higher. After the polymer film has dried, the coated substrate can be baked at about 50°C – 100°C for a few minutes to eliminate solvent and enhance adhesion.

As indicated by the dashed lined box in the Figure, referred to as step *3a*, if the substrate is of ceramic or other refractory material, after drying or curing, the polymer layer is heated to a temperature sufficiently high to pyrolyze or decompose the polymer material. This has the effect of diffusing the activated metal sites into the surface of the ceramic material with the result that following electroless plating, a very tenacious, resistant bond is obtained between ceramic and metal. The temperature required for pyrolysis depends, of course, on the nature of the polymer layer. For most of the listed polymers, a temperature range of about 150–1500°C is suitable, and generally a range of 400–700°C is adequate for most common polymers.

In the next step (4) the activated substrate can be metallized by deposition techniques involving the catalytic reduction of the desired metal or metal alloys from a chemical plating solution to form a metal layer. Electroless deposition solutions of nickel, cobalt, copper, alloys such as nickel- iron, nickel-cobalt and nickel-tungsten-phosphorus, and the like, are well known. After being metallized in this manner, additional metal layers can be deposited thereon in any suitable way. For example, the electroless metal layer can be deposited to a desired thickness and then an additional layer of suitable metal, such as copper, can be electroplated thereon. To form a magnetic film on a substrate, one can plate thereon cobalt or other magnetic material.

Referring now to FIGS. *2a–2f*, there is illustrated a process for forming a metal image on a substrate. The process schematically illustrates the preparation of micro electronic circuitry components on a circuit board, but can also serve to illustrate the preparation of a metal image for relief or intaglio printing, electrostatic or magnetic duplication elements, archival copies, or the like, as hereinabove stated. Referring initially to FIG. *2a*, a circuit board 10 is provided, constructed of polymeric material such as epoxy fiberglass. The substrate 10 has a substantially smooth top surface 12, but does not require special treatment or cleaning. Referring to FIG. *2b*, a photosensitive pre-plate solution is applied by simply dipping the substrate into the solution, or by brushing, spraying or rolling the solution unto the substrate surface 12. Ordinary drying or curing temperatures can be utilized, as previously described, to obtain a dry polymer or polymer-forming film 14. The composition of the pre-plate solution is such, as will hereinafter be described, that the polymer or polymer-forming film 14 is photosensitive and has dispersed therethroughout a multiplicity of catalytic plating sites. Depending upon the composition of the pre-plate mixture, the dried film 14 has a thickness of from about 20A to about 3000A. The maximum thickness may be selected so as to allow the desired resolution of the image.

Referring to FIG. *2c*, after formation of the film 14, a mask 16, which may be in the form of an imaged metal oxide film, master plate, photographic film, or the like, is placed in contact with the photosensitive film 14. In this illustration, the mask 16 is formed generally opaque, as at 18, with transparent image portions 20 formed therethrough, for use with a film 14 which is photosensitive in the negative mode. However, as will be detailed hereinafter, the film 14 can be formulated so as to be photosensitive in a positive mode, in which event the mask would be formed with generally transparent areas and carrying an image defined by opaque portions. After the mask 16 is in place, the film 14 is exposed to actinic light 22 through the mask 16.

Referring to FIG. *2d*, the actinic light exposure results in the polymerization, or further polymerization of the film 14 to yield regions 14', in correspondence to the image portions 20, which, as a result of photochemical reaction, are more resistant to solvent-removal than are the adjacent portions which have not been exposed. The substrate 10 is washed with a suitable solvent to remove the unexposed portions, leaving an image pattern in the form of hardened polymer 14' activated for electroless plating.

Referring to FIG. *2e*, the activated polymer image 14' can be metallized by deposition techniques as above described involving the catalytic reduction of desired metal or metal alloys from a chemical plating solution to form a metal layer 24 on the surface of the polymer image 14'. Thus, an electroless copper plating solution can be applied to form a copper image in correspondence to the mask image 20, which metal image can be utilized directly as an ultra-micro or micro electronic circuit. Referring to FIG. *2f*, the metal image can also be subjected to a further electroplating step, using any conventional electroplating technique, to form a thicker layer 26 of copper, or other metal thereon. Alternatively, one can plate cobalt or other magnetic material onto the copper image to form a magnetic image.

The photosensitive pre-plate solution which forms the film 14 can be formulated utilizing the previously described components but using as the binder material a photosensitive polymer or polymerformer. For example, as binder material one can utilize a photosensitive polyvinyl cinnamate, polyisoprene, polybutadiene or unsaturated polyacrylates, where exposure causes cross linking of the polymer in the light-struck areas rendering it insoluble in a solvent used to subsequently remove non-light struck polymer. One could also utilize a binder material supporting a reactable material and a photosensitizer. For example, in U.S. Pat. No. 3,046,125 aromatic amines, such as N-vinylcarbazole, and organic halogen compounds, such as carbon tetrabromide, are supported in a branched chain paraffin or isoparaffin hydrocarbon wax. In the present invention, the wax, solvent therefor, catalytic metal compound, aromatic amine and organic halogen compound can all be blended to form a photosensitive resist which upon development permits the electroless plating of metal upon the resist image. In another method for forming the photosensitive pre-plate solution, one can simply mix a photosensitive polymer or polymer-former with a fully formulated pre-plate solution, as previously described. Thus, one can mix from about 0.1 to about 10 parts by weight of polyvinyl cinnamate or polyisoprene with about 2 to about 10,000 parts by weight of pre-plate solution, the exact amounts depending upon the materials utilized taking into account coating and photoresist properties.

A broader aspect of this embodiment of the invention comprehends any means for intermittently dispersing fine (e.g., colloidal) particles of noble metal, as above described, within the surface of a thin polymer layer. Thus, fine particles, e.g., 5A – 2000A of palladium, platinum, palladium-tin alloy, gold, silver, iridium, rhodium, osmium and ruthenium can be incorporated directly into the binder material. Such particles may be obtained as a direct result of formulating the pre-plate solution as above described followed by in situ or subsequent reduction. For example, such reducing materials as a 1.5 weight percent solution of boron trihydride in tetrahydrofuran or formaldehyde, or a solution of $NaH_2PO_2$, $(CH_3)_2$ $NH.BH_3$ and/or NaK tartrate, can be agitated with the pre-plate solution to form finely dispersed particles of noble metal.

A particularly useful photosystem is that described in U.S. Pat. No. 3,485,629 in which a photoreactable nitrogen atomcontaining compound is dispersed with a photoinitiator in a hydrophilic film forming binder material. A catalytic metal compound, or fine particles of metal as above described, can be incorporated directly in such binder to form the photosensitive pre-plate solution.

Generally, a solid-film-forming component is used to achieve a hydrophilic continuous phase and may be any of a number of generally photographically inert materials, which are, in most cases, soluble in water or so finely dispersible therein in the concentration of use, that for practical purposes there is no distinction between solution and dispersion for these materials in the continuous phase. Such materials have been given above and include the starch and starch derivatives, proteins (i.e., casein, zein, gelatin, thiolated gelatin, etc.), alginates, gums and the like materials, which are generally considered to be derivatives of natural film-forming materials, any one of which in its conventional "water-soluble" form can be used in the practice of the present embodiment. In addition, synthetic water-soluble film-formers may also be used to particular advantage and such materials include polyvinyl alcohol, commercially available water-soluble polyacrylics or acrylates (i.e., water-soluble polyacrylic salts having substantially the molecular weight and water compatibility of the polyvinyl alcohol), various commercially available amine or aminealdehyde resins, etc. Also, a number of cellulose derivative film-formers may be used, and these include the various water-insoluble cellulose ethers, carboxymethylcellulose, hydroxypropylmethylocellulose, etc. Essentially, these materials are photo-insensitive and their principal function is that of forming a desired continuous phase which will retain the dispersed phase in discrete particle form.

The photosensitive material is a combination of at least two starting agents, one of which is a photoinitiator, and the other is a nitrogen atom-containing compound having certain structural characteristics. Photoinitiators useful in our process include organic halogen compounds selected from the group of compounds which produce free radicals or ions upon exposure to light of a suitable wavelength and in which there is present at least one active halogen selected from the group consisting of chlorine, bromine and iodine, attached to a carbon atom having not more than one hydrogen atom attached thereto. Compounds of the preferred group are described in U.S. Pat. Nos. 3,042,515, 3,042,516 and 3,042,517 and the descriptions and disclosures of these patents are hereby incorporated by reference. Examples of suitable organic halogen compounds include bromotrichloromethane, bromoform, iodoform, 1,2,3,4-tetrabromobutane, tribromoacetic acid, 2,2,2-tribromoethanol, tetrachlorotetrahydronaphthalene, 1,1,-tribromo-2-methyl-2-propanol, carbon tetrachloride, p-dichlorobenzene, 4-bromobiphenyl, 1-chloro-4-nitrobenzeene, p-bromoacetanilide, 2,4-dichlorophenol, 1,2,3,4-tetrachlorobenzene, 1,2,3,5-tetrachlorobenzene, brominated polystyrene, n-chlorosuccinimide, n-bromosuccinimide, 2-chloroanthraquinone, tetrabromophenolphthalein, tetrabromo-o-cresol, and the like. Particularly effective compounds include carbon tetrabromide, tribromochloromethane, dibromodichloromethane, pentabromoethane, hexachloroethane and hexabromoethane. In general, bromides are preferred.

The nitrogen atom-containing compound can be a compound having a nitrogen atom attached directly to at least one benzene ring, the benzene ring being free from carbon atom substitution in the position para to the nitrogen atom attachment. The process is also particularly suitable with nitrogen-containing compounds in which the nitrogen atom is a member of a heterocyclic ring. Still another type of nitrogen-containing compound with which the process is particularly useful in an N-vinyl compound.

It will be appreciated that there is substantial overlap between the above types ofo nitrogen-atom-containing compounds and that the process is useful with photosensitive combinations that are formulated with nitrogen-containing compounds falling within one, two or even all three of the above terms; e.g., N-vinylcarbazole. It will also be appreciated that there is no generic term available in accepted chemical terminology that will effectively embrace all of the above types of nitrogen-containing compounds. It is merely important to note that photosensitive combinations containing a compound which has at least one of the above characteristics are readily applicable to these processes. Photosensitive combinations containing compounds having more than one of the above characteristics lend themselves even better to these processes. Examples of particularly effective nitrogencontaining compounds include N-vinylcarbazole, N-ethylcarbazole, indole and diphenylamine.

Optionally, a dye sensitizer may be present with the photosensitive material which extends the spectral sensitivity of the combination. Examples of such sensitizers include the rhodamine dyes and dye bases; the pinacyanol and related carboyanin or cyaninetype dyes and dye bases such as pinaflavole, ethyl red, quinaldine red and neocyanine; the eosin and erythrosin dyes and dye bases; the triphenylmethane dyes and dye bases such as crystal violet and malachite green; the thiazine dyes and dye bases such as methylene blue and thionine; the anthraquinonoid dyes and dye bases such as alizarin; the acridine dyes and dye bases such as alizarin; the acridine dyes and dye bases such as acridine orange; the styryl (including azastyryl) dyes and dye bases such as 4-(p-dimethylaminostyryl)quinoline dye or dye bases; and the like.

By utilizing an N-vinyl compound an additional degree of flexibility is obtained. In the environment of the hydrophilic continuous phase, the combination of organic halogen compound and N-vinyl compound is capable of undergoing two separate and distinct reactions on exposure to actinic light. In one reaction, in a negative working mode, sufficient phototype by-products occur in light-struck areas to break down the structure of the binder so that those areas of the film are removed when washed with water or other solvent. In another reaction, in a positive working mode, "weaker" light is used initially and a polymer is thought to be first formed which is relatively stable and provides little reaction with the binder. However, after image-wise exposing with such "weaker" light, the film can be blanket exposed to "stronger" light to form sufficient by-products to break down the binder and render it soluble in water or other solvent. However, such blanket exposure does not have such effect on the initially light-struck areas. These two reactions are competitive, the kinetics of which say that one or the other will predominate, depending upon the wavelength-intensity-exposure of light, with the reaction leading to binder breakdown occuring with "stronger" light. By utilizing a "negative working" method of exposure and further containing dispersed therein a soluble compound of noble metal, such as palladium chloride or the like, one can use a mask wherein the image is defined by opaque portions against a transparent background. On the other hand, by utilizing a "positive working" method of exposure, one can use a mask wherein the image is defined by transparent portions against an opaque background.

In general, the weight ratios of the nitrogen compound: halogen compound starting agent may vary widely, from a minimum practical weight ratio of about 1:1 to a maximum ratio of about 50:1. If the proportion of halogen compound used is greater than that specified in the foregoing range, it is ordinarily found that no practical advantage is obtained, and, in general, the weight ratio used is not below about 1:2 except in special situations wherein losses of a halogen compound (e.g., carbon tetrabromide) are contemplated prior to the actual use. Also, if the amount of halogen compound used is less than the minimum just specified, the combination may be inadequately photosensitive. When a combination of two or more organic halogen compounds are used in the practice of the instant invention in a continuous water-penetrable phase, it has been found that advantages are often obtained in the use of weight ratios of 5:1 to about 20:1.

With regard to the relative weights of (1) the nitrogen and halogen compounds in the dispersed phase compared to (2) the solids in the continuous phase, it is found that the solids weight ratio of (1): (2) is preferably about 1:2, but may range from a maximum practical ratio of about 5:1 to a practical minimum ratio of abut 1:50. The continuous phase may be 100% "solids" in the sense that the entire system solidifies without any loss of water, but generally the solids-to-liquid ratio in the continuous phase is within the range of about 1:1 to about 1:30.

Any of the common organic solvents which have substantial miscibility in water can be used to remove polymer former which has not fully reacted. Generally water or aqueous-organic solvent solutions, containing up to 90% organic solvent, are useful and include the following or mixtures thereof with water: ethanol, methanol, isopropanol, ether, benzene, octane, glycerol, chloroform, acetic acid, ethyl acetate, carbon tetrachloride, carbon disulfide, dimethylsulfoxide, acetone, m-dioxane, p-dioxane, tetrahydrofuran, and the like. Those organic solvents which are not directly soluble in or miscible with water can be utilized in a ternary system mixed with an organic solvent which is miscible, e.g., acetone.

Further descriptions and examples of nitrogen atom-containing ncompounds, organic halogen compounds, dispersing mediums and other compositions useful herein can be found in U.S. Pat. Nos. 3,485,629 and 3,476,562.

The following examples, in which all parts are by weight unless otherwise specified, will illustrate various embodiments of the invention.

EXAMPLE 1

A pre-plate solution was prepared by dissolving 0.05 part of palladium chloride in 100 parts of methyl ethyl ketone and then dissolving 0.25 part of a polyvinyl chloride copolymer (sold under the trade name Geon 222 by B. F. Goodrich) in the solution to obtain aa polymer solution. A glass substrate was dipped into the solution and air dried to a thickness about 500 A. The coated substrate was then heated to about 500°C. for about 10 minutes whereupon the polymer and palladium salt decomposed leaving a uniform monolayer of palladium metal. The treated glass substrate was examined microscopically and palladium particles also were found to be uniformly distributed with a visible spacing of about 2 microns. After washing and rubbing, these particles were not removed.

The glass substrate was then placed for about 3 minutes in an electroless aqueous cobalt plating bath containing 3.5% $CoSO_4$, 7.0% $Al_2(SO_4)_3$, 2.0% $NaH_2PO_2$ and 15.0% NaK tartrate. A flawless cobalt mirror was obtained which was not removed by Scotch tape or by scratching with a knife.

EXAMPLE 2

A sheet of Mylar was dipped into the pre-plate solution of Example 1 and air dried to a thickness of about 200 A. The coated Mylar sheet was then placed for about 5 minutes in an electroless cobalt plating bath whereupon a layer of cobalt was deposited upon the Mylar.

EXAMPLE 3

The procedure of Example 2 was repeated except that the coated Mylar was placed for about 2 minutes in an electroless nickel plating bath of commercial composition (sold under the trade name Enplate Ni 415-A by Enthone Co.). A layer of nickel was deposited on the Mylar.

EXAMPLE 4

A circuit board of epoxy fiberglass was sprayed with the pre-plate solution of Example 1 and air dried to a thickness of about 2000 A. The coated board was then placed for about 5 minutes in an electroless nickel plating bath, whereby a layer of nickel was deposited.

EXAMPLE 5

A pre-plate solution was prepared by dissolving 0.05 parts of palladium chloride and 0.25 parts of polyvinyl alcohol in 100 parts of water. A sheet of Mylar was dipped into the solution and air dried to a thickness of about 2500 A. The Mylar sheet was then placed for about 3 minutes in an electroless nickel plating bath whereupon a layer of nickel was deposited.

EXAMPLE 6

Following the procedure of Example 5, a sheet of acrylonitrile-butadiene-styrene was plated with nickel. Prior to dipping in the pre-plating solution, the sheet was dipped in toluene and washed with isopropanol to remove surfactants and plasticizers on the surface, but no other pretreatment was required.

EXAMPLE 7

A pre-plate solution was prepared dissolving 0.066 parts of palladium chloride and 0.075 parts of acrylonitrile-butadiene (sold under the trade name Hycar 1432 by B. F. Goodrich) in 100 parts of methyl ethyl ketone. A sheet of Mylar was dipped into the solution and air dried to a thickness of about 500 A. The coated sheet was then placed for about 7 minutes in an electroless copper plating bath of commercial composition (sold under the trade name Cuposit 328 by Shipley Co.) to deposit a layer of copper thereon.

EXAMPLES 8–9

Following the procedure of Example 7, respective Mylar sheets were plated with respective cobalt and nickel electroless plating baths to deposit corresponding layers of metal.

EXAMPLES 10–11

Epoxy fiberglass circuit boards were dipped into the pre-plate solution of Example 7 and air dried to thicknesses about 500 A, following which they were plated with respective electroless copper and nickel plating baths to deposit corresponding layers of metal.

EXAMPLES 12–14

Following the procedure of Example 7, sheets of Kapton polyamide film were dipped into the pre-plate solution, to form a layer of Hycar polymer. The Hycar was pyrolyzed and the resultant sensitized Kapton film sheets were placed in cobalt, copper and nickel plating baths to deposit layers of cobalt, copper and nickel on respective sheets.

EXAMPLE 15

A glass substrate was dipped into the pre-plate solution of Example 7, air dried to a thickness of about 500 A and then heated to about 550°C for abut 10 minutes to pyrolyze the coating. The treated glass substrate was then placed for about 2 minutes in an electroless nickel plating bath to obtain a nickel mirror.

EXAMPLE 16

A pre-plate solution was prepared by dissolving 0.066 parts of palladium chloride and 0.075 part of a polyamide (sold under the trade name Versalon 1112 by Generall Mills Corp.) in 100 parts of isopropanol. A shet of acrylonitrile-butadiene-styrene was cleaned by treating the surface with toluene and then isopropanol, and the clean sheet was dipped into the pre-plate solution and air dried and baked at about 50°C to a thickness of about 500 A. The coated sheet was then placed for about 3 minutes in an electroless nickel plating bath to deposit a layer of nickel thereon having good adhesion.

EXAMPLE 17

A pre-plate solution was prepared by dissolving 0.066 part of palladium chloride and 0.15 part of gelatin (sold under the trade name Klucel E by Hercules Chemical Co.) in 100 parts of methanol. A sheet of acrylonitrile-butadiene-styrene was cleaned by treating the surface with toluene and then isopropanol. The cleaned sheet was dipped into the pre-plate solution and then air dried to a thickness of about 1000 A. The coated sheet was then placed for about 3 minutes in an electroless nickel plating bath to deposit a layer of nickel thereon.

EXAMPLE 18

A pre-plate solution was prepared by dissolving 0.066 part of palladium chloride and 0.15 part of a water soluble acrylic polymer (sold under the trade name Aqua Hyde 100 by Lawter Chemical Co.) in 100 parts of water. A sheet of treated acrylonitrile-butadiene-styrene was dipped into the solution and air dried to a thickness of about 1000 A. The coated sheet was then placed for about 3 minutes in an electroless nickel plating bath to deposit a layer of nickel thereon.

EXAMPLE 19

A pre-plate solution was prepared by dissolving 0.10 part of palladium chloride and 0.30 part of water soluble acrylic polymer (sold under the trade name Zinpol 1590 by Zinchem Co.) in 100 parts of methanol. A sheet of acrylonitrile-butadiene-styrene was treated by dipping in toluene and then washing with isopropanol. The clean sheet was dipped into the pre-plate solution and air dried to form a coating having a thickness of about 2500 A. A similar sheet of acrylonitrile-butadiene-styrene, but untreated, was also dipped into the solution, then air dried to form a coating having a thickness of about 2500 A. Both sheets were placed for about 4 minutes in an electroless nickel plating bath to deposit layers of nickel thereon. Both sheets were useful for electroless plating and electroplating.

EXAMPLE 20

A photosensitive pre-plate solution can be prepard by mixing a pre-plate solution with 1.5 parts of sensitized polyvinyl cinnamate solution (sold as KPR by Eastman Kodak). A circuit board substrate of epoxy-fiberglass can be dipped into the resulting photosensitive pre-plate solution and dried to form a solid film of the photosensitive pre-plate components. The film can be exposed to a 100 watt lamp at 12 inches for 1 minute through a mask containing an electronic circuit printed thereon in negative fashion. An image of the circuit can thus be obtained in the form of a crosslinking of the polyvinyl cinnamate in the light-struck regions. The surface of the substrate can then be washed with xylene to remove the unexposed portions of the film. Thereafter, the film can be placed for about 5 minutes in the electroless copper plating bath, as described in Example 7, to deposit a layer of copper on the remaining film portions. The circuit board can then be placed in an electroplating bath and additional copper plated to a desired thickness in accordance with techniques well known to the art.

EXAMPLE 21

The procedure of Example 20 can be followed except that the polyvinyl cinnamate is replaced with polyisoprene on a part for part basis.

EXAMPLE 22

A photosensitive pre-plate solution can be prepared by dissolving 4 parts of N-vinyl carbazole and 3.2 parts of carbon tetrabromide in 2.4 parts of ethyl acetate which, together with 3 parts of palladium chloride are added to 50 parts of a 20 weight percent aqueous gelatin solution. The formulation is agitated and then coated with a Byrd applicator onto a circuit board to a wet thickness of 0.003 inch, and then dried gently at 24°C.

A negative photographic film containing an electronic circuit image to be duplicated, wherein the circuit is printed as transparent areas on a generally opaque background, is placed in contact with the coated board and exposed to light from a 300 watt lamp at about 3 feet for about 2–3 seconds. The thus exposed film is heated to about 70°C for about 5 seconds and then blanket exposed to light from a 275 watt G.E. sunlamp at about 15 inches, for about 10 seconds. The coated board is then heated to about 70°C for about an additional 10 seconds. The plated board is then immersed in a 15:85 volume percent acetone:water solution and rubbed while in the solution with a cloth for about 30 seconds so as to remove the second exposed regions, leaving behind a gelatin-polymer image of the circuit.

The board can then be dipped into a copper electroless plating bath and thereafter electroplated, as described in Example 20.

EXAMPLE 23

A pre-plate solution can be prepared by dispersing 5 parts of finely divided palladium metal (having an average particle size of about 0.02 micron) in 200 parts of 5 percent by weight of polyisoprene in xylene sensitized with 0.1 part of Michler's Ketone. The solution can be applied to a circuit board and air dried to a thickness of about 1000 A. The coated board can then be exposed through a mask utilizing a 100 watt xenon lamp as a light source, for about 2 minutes, and then washed with trichloroethylene to remove unexposed portions. The resist pattern thus produced can be further treated in accordance with the procedure of Example 20 to produce a micro-circuit.

EXAMPLE 24

A pre-plate solution can be prepared by dissolving 0.5 part of sodium carboxymethyl cellulose in 200 parts of distilled water and mixing this with 200 parts of a solution containing 0.25 percent acidic palladium chloride, 10 percent hydrochloric acid and 75 percent distilled water (all percentages by weight). A sheet of untreated acrylonitrile-butadiene-styrene can be dip coated in the above solution to a thickness of about 1000 A. After air drying, the coated sheet can then be electrolessly plated as in Example 7.

EXAMPLE 25

A pre-plate solution can be prepared as in Example 24 with the exception that 0.1 to 100 parts of polymer spheres may be included in the sodium carboxymethylcellulose solution. The spheres can range in size from 0.005 to 2.0 microns and may be produced in the solution by conventional emulsion polymerization of monomers such as vinylchloride or vinylacetate. The resultant pre-plate solution may be coated, dried and electrolessly plated.

In each of the foregoing Examples 1–25, in place of the palladium salt, one can utilize silver bromide, palladium nitrate, palladium trimethylbenzyl ammonium nitrate, nickel hexachloropalladate, palladium hydroxidie or gold chloride.

We claim:

1. A method for forming a metal image on an organic polymer base, which comprises:

combining in solution a metal-containing component capable of forming catalytic bonding sites for an electroless metal plating process, photosensitive polymerizable binder material and at least one solvent for said binder material and said component, the weight ratio of said binder material to the metal portion of said metal-containing component in said combination being from about 0.3:1 to about 15:1, said combination having a viscosity, under the conditions of its application to said base, equivalent to a Newtonian fluid viscosity of about 0.2 to about 100 centipoises:

applying said combination to said base and drying at a temperature of 20°–150° so as to form a layer thereof about 20 A to about 3000 A thick on said base;

photographically exposing said layer to form solvent-resistant polymerized image portions on said plate against a solvent-soluble background;

thereafter treating said layer with solvent to remove said background; and thereafter electrolessly plating said image portions to form said metal image.

2. The invention according to claim 1 in which said component comprises a metal compound capable of being reduced to its active metal constituent so as to form said catalytic bonding sites.

3. The invention according to claim 1 in which said component comprises a plurality of noble metal particles of about 5 A to about 2000 A in size.

4. The invention according to claim 2 in which the weight ratio of said binder material to the metal component of said metal compound in said combination is about 0.3:1 to about 8:1.

5. The invention according to claim 1 in which said combination has a viscosity, under the conditions of its application to said base, equivalent to a Newtonian fluid viscosity of about 0.2 to about 10 centipoises.

6. The invention according to claim 2 in which said metal compound is a palladium salt.

7. The invention according to claim 1 in which said binder material additionally comprises one or more non-photosensitive polymers or non-photosensitive polymer formers.

* * * * *

PO-1050
(5/69)

UNITED STATES PATENT OFFICE
CERTIFICATE OF CORRECTION

Patent No. 3,900,320 Dated August 19, 1975

Inventor(s) John H. Rolker & Bradley A. Carson

It is certified that error appears in the above-identified patent and that said Letters Patent are hereby corrected as shown below:

Col. 1, line 13, change "1970" to --1971--.

Col. 4, line 32, after "etching" add --step--.

Col. 8, line 39, change "serveral" to --several--.

Col. 11, line 24, change "atomcontaining" to --atom-containing--.

Col. 12, line 14, change "nitrobenzeene" to --nitrobenzene--.

line 36, change "ofo" to --of--.

line 51, change "nitrogencontaining" to --nitrogen-containing--.

line 59, change "cyaninetype" to --cyanine-type--.

Col. 14, line 13, change "ncompounds" to --compounds--.

line 27, change "aa" to --a--.

Col. 15, line 56, change "abut" to --about--.

line 65, change "Generall" to --General--.

line 66, change "shet" to --sheet--.

Col. 16, line 50, change "prepard" to --prepared--.

Col. 18, line 34, after "150°" add --C--.

Signed and Sealed this

*twenty-first* Day of *October 1975*

[SEAL]

*Attest:*

RUTH C. MASON
*Attesting Officer*

C. MARSHALL DANN
*Commissioner of Patents and Trademarks*